United States Patent [19]
Law et al.

[11] Patent Number: 5,466,166
[45] Date of Patent: Nov. 14, 1995

[54] EJECTION MECHANISM

[75] Inventors: David Law, Burlingame; Dennis Boyle, Palo Alto; Matt Herron, Menlo Park, all of Calif.

[73] Assignee: Apple Computer, Inc., Cupertino, Calif.

[21] Appl. No.: 107,185

[22] Filed: Aug. 13, 1993

[51] Int. Cl.⁶ .................................................. H04R 13/62
[52] U.S. Cl. .......................................... 439/159; 439/157
[58] Field of Search ................................... 439/152–160, 439/372, 350, 351; 361/399, 413

[56] References Cited

U.S. PATENT DOCUMENTS

| | | | |
|---|---|---|---|
| 5,051,101 | 9/1991 | Komatsu | 439/159 |
| 5,305,180 | 4/1994 | Mitchell et al. | 439/159 |

FOREIGN PATENT DOCUMENTS 0344850  12/1989  European Pat. Off. ............... 439/911

*Primary Examiner*—David L. Pirlot
*Attorney, Agent, or Firm*—Apple Computer, Inc.

[57] ABSTRACT

A housing and ejection mechanism for PCMCIA electronic "smart cards" is disclosed. The ejection mechanism comprises a pair of cooperating lever arms and springs. When a "smart card" is inserted into the housing, the two lever arms pivot into the housing, extending an ejection spring. As the spring is pulled back by means of the lever arms, insertion of the card requires only slightly more force than would be needed to connect a "smart card" with its socket were no spring present. Full insertion of the card leaves the two lever arms coupled, but with only one of the lever arms locked in position. When the user triggers the ejection process, the two levers are mechanically separated and one of them applies the full spring force to the "smart card", freeing it from its socket and starting to push it out of the housing. After the first arm frees the "smart card" from its socket, it frees the second lever arm from its latch. The two lever arms then cooperate to push the "smart card" further out of the housing. Once the ejection spring is fully released, a second small spring reunites the two levers, preparing the mechanism for the next insertion of a "smart card". As only a small amount of force is needed to separate the two lever arms, a simple electronic ejection means can be used to trigger the ejection of the "smart cards".

12 Claims, 12 Drawing Sheets

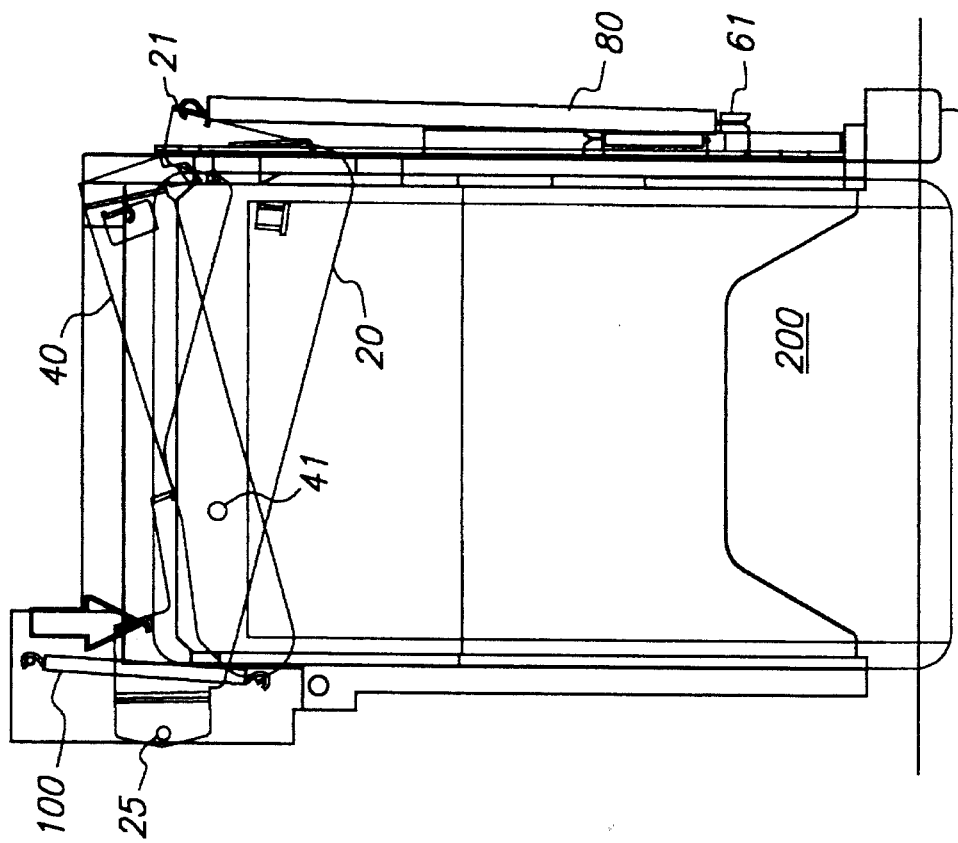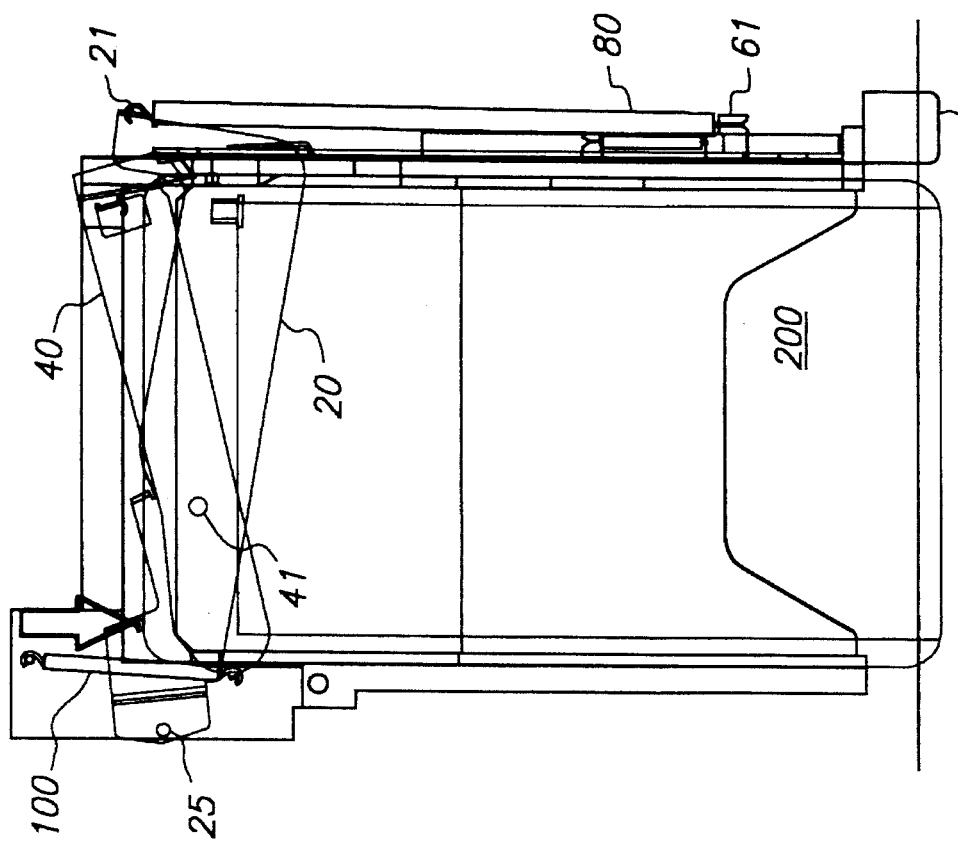

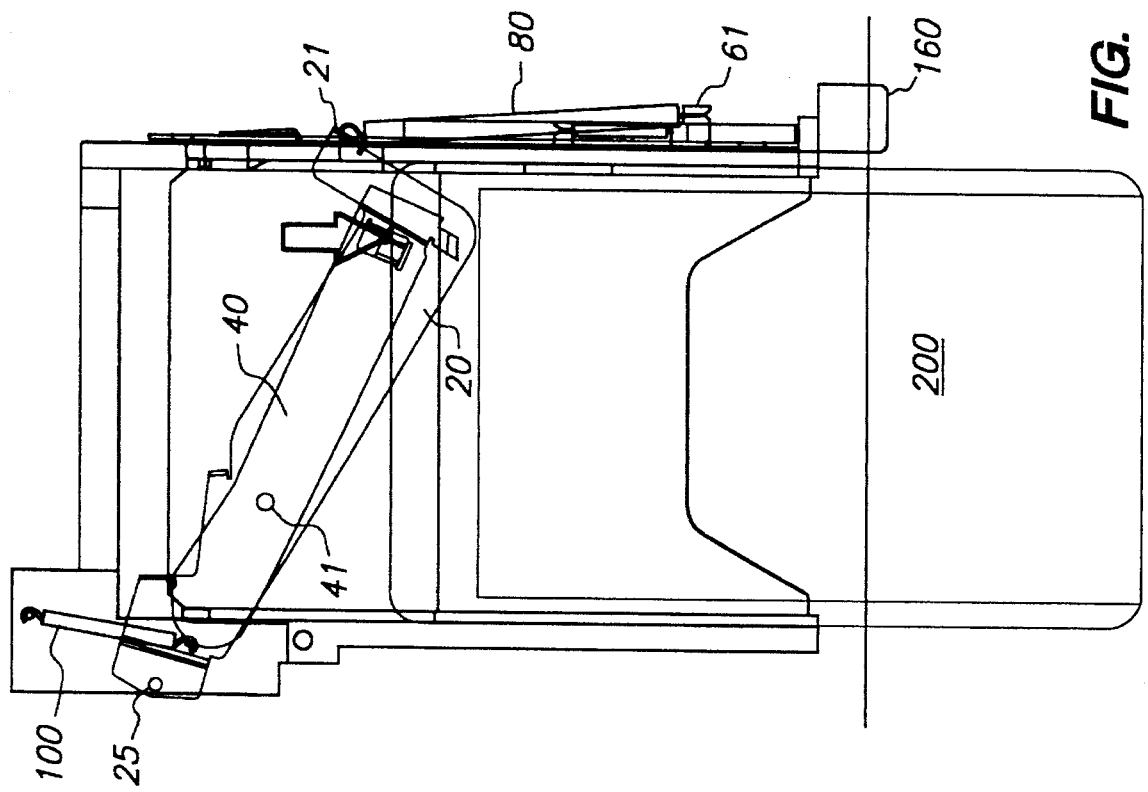
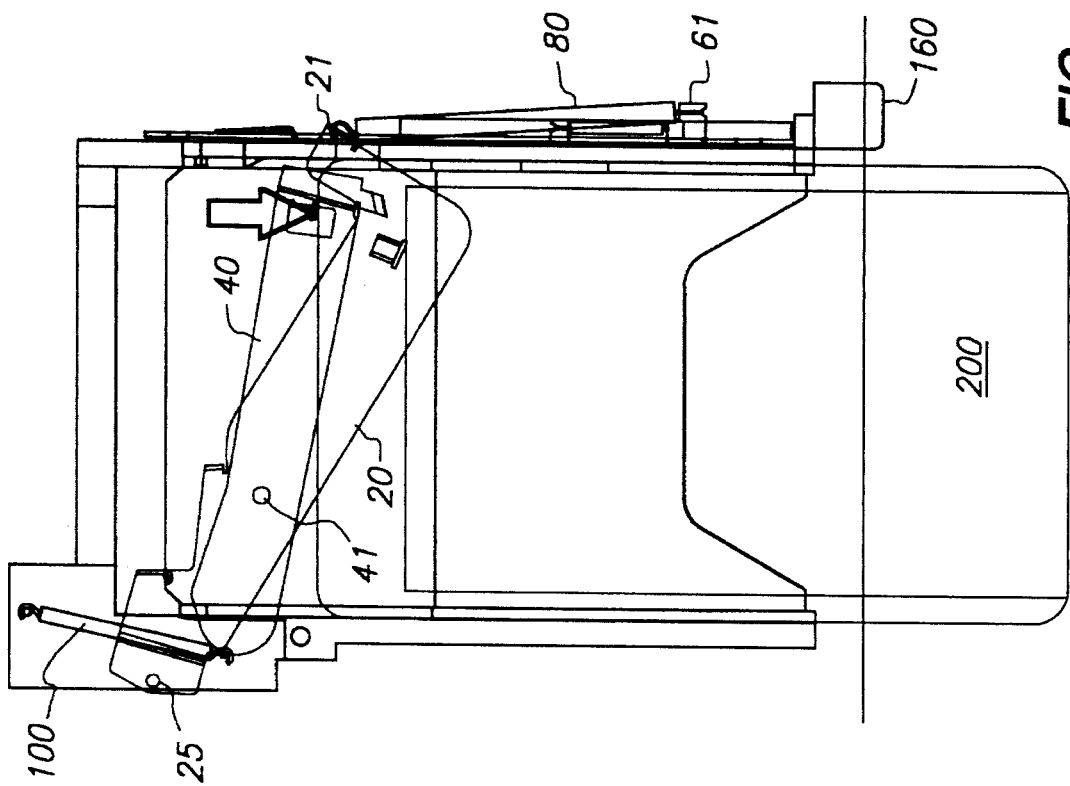

EJECTION MECHANISM

BACKGROUND OF THE INVENTION

The present invention is in the field of digital computers and their related peripherals. In particular, it relates to PCMCIA cards and their insertion into and ejection from computing devices.

Portable digital computers comprise one of the fastest growing segments of the computer industry. Users of portable computers make many mutually contradictory demands on the designers of such machines. Small size and light weight are critical, but users still demand that their portable machines provide them with all or nearly all of the capabilities of their home- or office-bound computer. Unfortunately, the permanent incorporation of devices such as floppy disk drives, modems, extra memory and others to provide the capabilities that the user demands simultaneously increases the computer's weight and often its size.

Relatively recently, small removable devices have become available to designers of portable computers, which devices allow the addition of particular features for whatever period of time that the user needs them, but which can be easily removed whenever these capabilities are no longer desired. At present such cards include flash memory cards, modem cards, hard disk drives and many other similar devices. The size of such cards and their electrical interface has been agreed upon by the Personal Computer Memory Card International Association ("PCMCIA") and the cards are generically referred to in the industry as PCMCIA cards. For purposes of this application, such PCMCIA cards will be referenced as "cards" and the entire class of devices in which they can be used will be referenced as "computers". No limitations regarding the functions of such cards or their use in any type of device should be inferred therefrom.

As the availability and use of these cards has increased, many different mechanisms have been used for both housing the cards while they are inserted in the computer and for ejecting them from the computer. As a result of cost and size considerations, these card housings and ejection mechanisms are usually mechanical, having no motor to assist the operation of the device.

One such housing and ejection mechanism is illustrated in co-pending patent application Ser. No. 08/023,262, filed Feb. 23, 1993, entitled "Ejection Mechanism For Electronic Smart Cards" and assigned to Apple Computer, Inc. That application is incorporated herein for all purposes. The mechanism described therein utilizes a slide fitting which is coupled to a pair of lever arms. Movement of the slide pivots the lever arms, which in turn apply force to the rear of the card, removing it from its electrical connector and pushing it far enough outside the housing so that the user can easily grasp and remove it from the computer. Although the mechanism functions reasonably well, it requires a relatively long travel path for the slide. Additionally, there is no ability to eject the card without the user providing the necessary ejection force.

Other known housings and ejection mechanisms operate on the same principles as those described in the incorporated reference. Various levers and slides are used to apply sufficient mechanical force to the rear of the card to remove it from its connector and eject the card from the computer. In one, in order to generate sufficient force without requiring that the eject pushbutton travel very far, a cam is located at the end of the pushbutton's slide. Although this creates a smaller and more compact ejection mechanism, it still requires that the user provide all the force necessary to eject the card at the time of the card's ejection. Even with the cam, the pushbutton slide extends further beyond the card housing than is desirable.

Although at least one manufacturer of card housings and ejection mechanisms has thought to provide springs to assist the ejection process, the resultant mechanism has several important disadvantages. As two springs are located at the rear of the card housing, the springs being compressed and latched as cards are fully inserted into the housing, a large amount of force is needed to compress the springs. Generally, a card requires 9 lbs. of force to remove it from its connector. Therefore, as the housings are generally constructed to house up to two cards at a time, two 9 lb. springs are needed, which requires that the user insert the cards with 18 lbs. of force. This amount of force is generally unacceptable for a typical user. Once released, this ejection mechanism can also apply too much force to the card, causing it to leave the housing completely upon ejection.

Known mechanisms have to date failed to provide a card housing and ejection mechanism which does not require a great deal of force to insert cards into it, which can eject cards smoothly and easily, without the user providing the mechanical force for the ejection, and which can respond to an internal, computer generated command to eject the card. A housing for this ejection mechanism which can hold the cards in a very compact package without a pushbutton extending from the housing and without the cards themselves extending from the housing would also be very desirable.

SUMMARY OF THE INVENTION

In its first preferred embodiment, the present invention comprises a housing for up to two cards and ejection mechanisms for both cards. Although this first embodiment is illustrated as being capable of housing and ejecting two separate cards, this description will only discuss one of the ejection mechanisms in detail. In this first embodiment, the construction and operation of the second ejection mechanism is the mirror image of the first. In other embodiments, the different ejection mechanisms will not necessarily be identical.

As a card is inserted into the present invention and contacts a fitting on a wind lever arm, an ejection lever arm and the wind lever arm, which share a pivot point and which are severably coupled together, are pushed backwards into the housing, pivoting about the pivot point and extending a first ejection spring. In the present invention, the user must supply only a small amount of force (about 1 lb.) to insert the card. As the card is fully inserted into the housing, the wind lever arm latches into place. The ejection lever arm is not latched into place, but its severable connection with the wind lever arm prevents it from being swung forward by the first ejection spring.

When the user wishes to eject the card, a small ejection button is pushed. Pushing this button breaks the severable connection between the ejection lever arm and the wind lever arm, allowing the ejection lever arm to begin moving forward about the first pivot point. A small fitting on the ejection lever arm come into contact with the card shortly after the ejection lever arm begins moving forward and begins pushing against the card. Given the geometry of the ejection lever arm, the first pivot point and the fitting which contacts the card, as well as the force of the first ejection spring, a large force, sufficient to disconnect the card from its electrical connector, is applied. This large force continues to be applied to the card for a short distance.

As the ejection lever arm swings forward, the wind lever arm is moved a small sideways distance, which disconnects it from its latch. After the ejection lever arm continues to swing forward by another few degrees, a stop on the ejection lever arm contacts the wind lever arm and the wind lever arm begins to pivot forward along with the ejection lever arm. At this point, the small fitting on the ejection lever arm loses contact with the card and a second small fitting on the wind lever arm comes into contact with the card and begins pushing the card, under the impetus of the first ejection spring. Given the respective placement of the fittings, the fitting on the ejection lever arm provided a large amount of force (roughly 9.5 lbs.) over a short distance (4 mm) and the fitting on the wind lever provides a smaller motive force to the card, but over a longer distance.

Finally, as the first ejection spring returns to its fully relaxed state, a second, re-cocking spring pulls the ejection lever arm and the wind lever arm into their original positions, which reestablishes the severable connection between the two and readies the housing for the reinsertion of the card.

In a second preferred embodiment, a small electrically activated mechanism provides the force needed to break the severable connection between the two lever arms. In this embodiment, the mechanism is a small piece of memory metal which shrinks when a current is passed through it. The memory metal is then restretched to its original length by a small return spring.

The present invention in all its embodiments allows the user to insert cards into the housing with only a small amount of force more than that required merely to connect the card to its socket. As only a very small force is needed to initiate the ejection of the cards, the mechanical eject button does not need to extend very far from the housing. Indeed, as only 1 to 2 mm of travel is generally required to break the severable connection, the ejection button may be mounted flush with the housing. The two stage ejection process allows for fully ejecting the card without simultaneously throwing it violently out of the housing. Additionally, the need for only a small force to eject the card allows for the incorporation of a very simple electrical ejection activation means.

The present invention will now be described in detail, in several of its preferred embodiments. Reference will be made to the drawings listed and described below.

BRIEF DESCRIPTION OF THE DRAWINGS

FIGS. 5a through 5j are wire drawings showing the operation of the first embodiment of the present invention as a card is ejected.

DETAILED DESCRIPTION OF THE PREFERRED EMBODIMENTS

Figure 1:
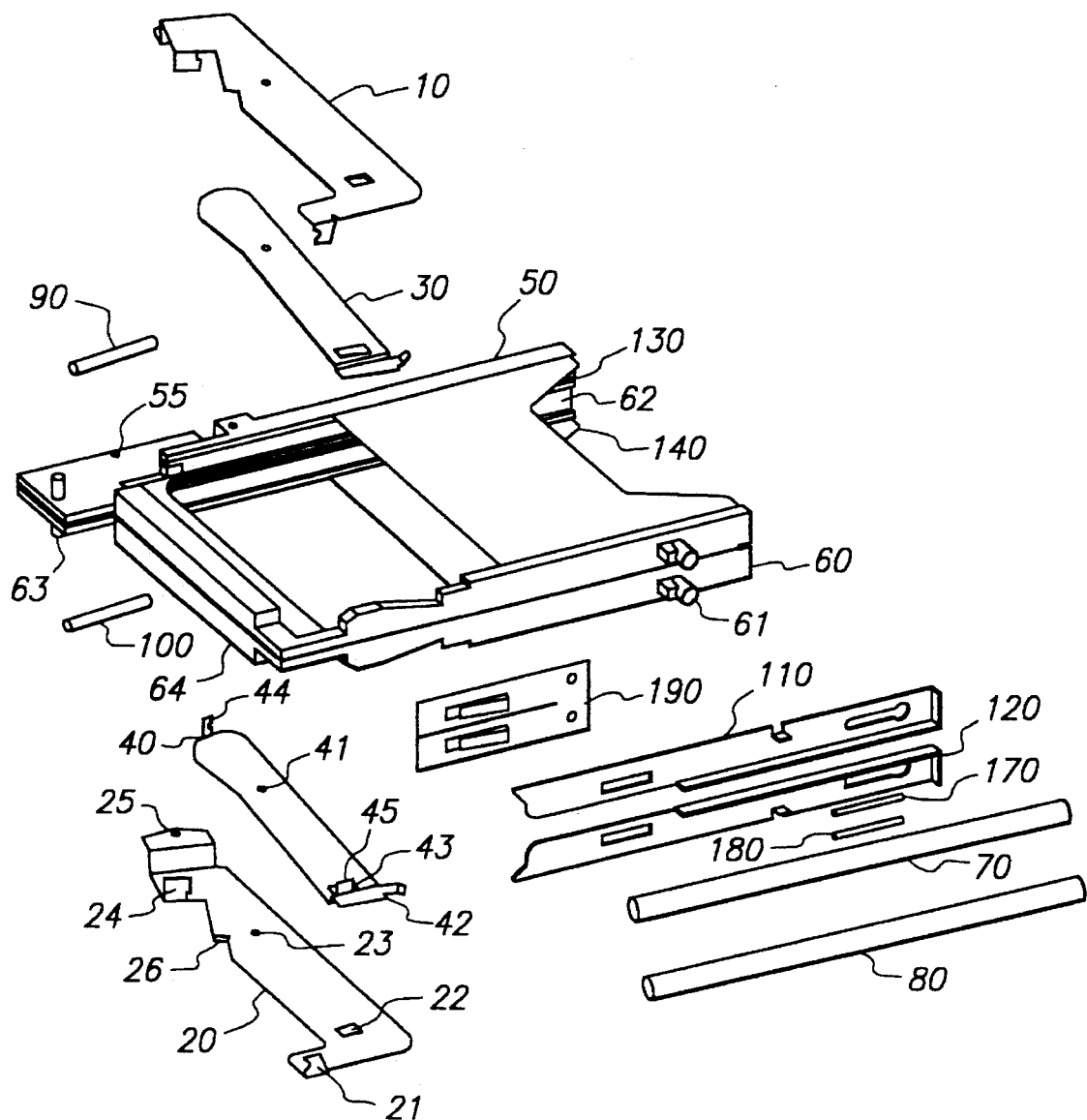
FIG. 1 is an exploded isometric drawing of a first preferred embodiment of the present invention.
Figure 2:
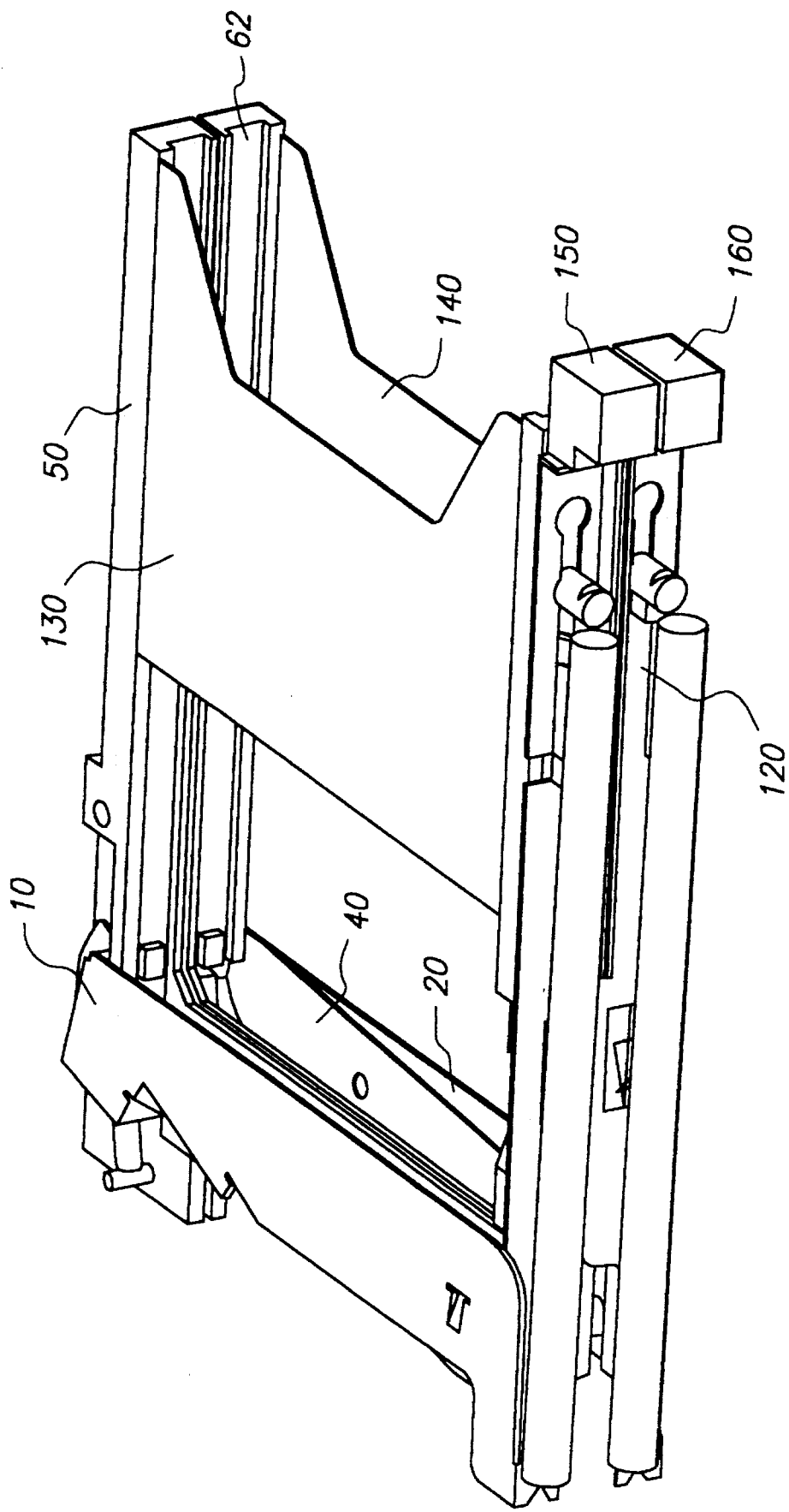
FIG. 2 is a top perspective of the assembled first embodiment of the present invention.

As shown in FIG. 1, the first embodiment of the present invention is comprised of top ejection lever arm 10, bottom ejection lever arm 20, top wind lever arm 30, bottom wind lever arm 40, top carrier 50, bottom carrier 60, top first ejection spring 70, bottom first ejection spring 80, top re-cock spring 90, bottom re-cock spring 100, top unlatch bar 110, bottom unlatch bar 120, top metal shield 130, bottom metal shield 140, latch springs 170 and 180 and one-way latch 190. FIG. 2 further shows top ejection button 150 and bottom ejection button 160.

As the construction and operation of both the top and bottom housing and ejection mechanisms are the same, albeit mirror images of one another, this description will only describe in detail the construction and operation of the bottom housing and ejection mechanism.

As shown in FIG. 1, bottom ejection lever arm 20 is further comprised of first ejection spring attachment arm 21, male severable coupling 22, first wind lever pivot 23, first card ejection arm 24, ejection lever arm pivot 25, and wind lever catch arm 26. Bottom wind lever arm 40 further comprises second wind lever pivot 41, latch ratchet 42, female severable coupling 43, re-cock spring attachment arm 44, and second card ejection arm 45. Bottom carrier 60 is further comprised of card slots 62, ejection spring attachment point 61, re-cock spring attachment point 63, and card connector 64. Not shown in FIG. 1, but immediately below top carrier ejection lever arm pivot socket 55, is bottom carrier ejection lever arm pivot socket 65.

Figure 3:
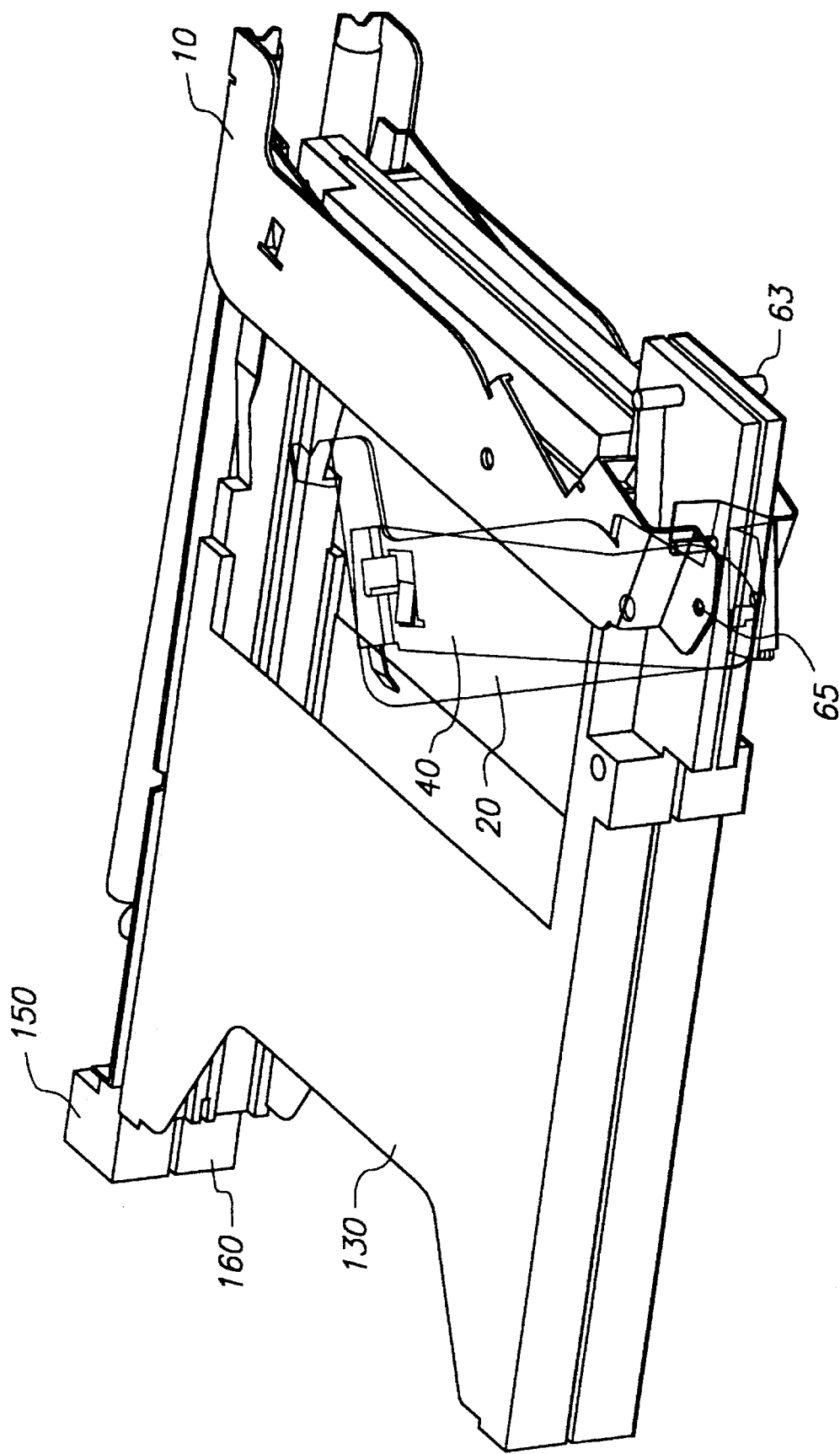
FIG. 3 is a second top perspective of the first embodiment of the present invention, showing the lower eject lever arm and wind lever arm in their forward position.
Figure 4B:
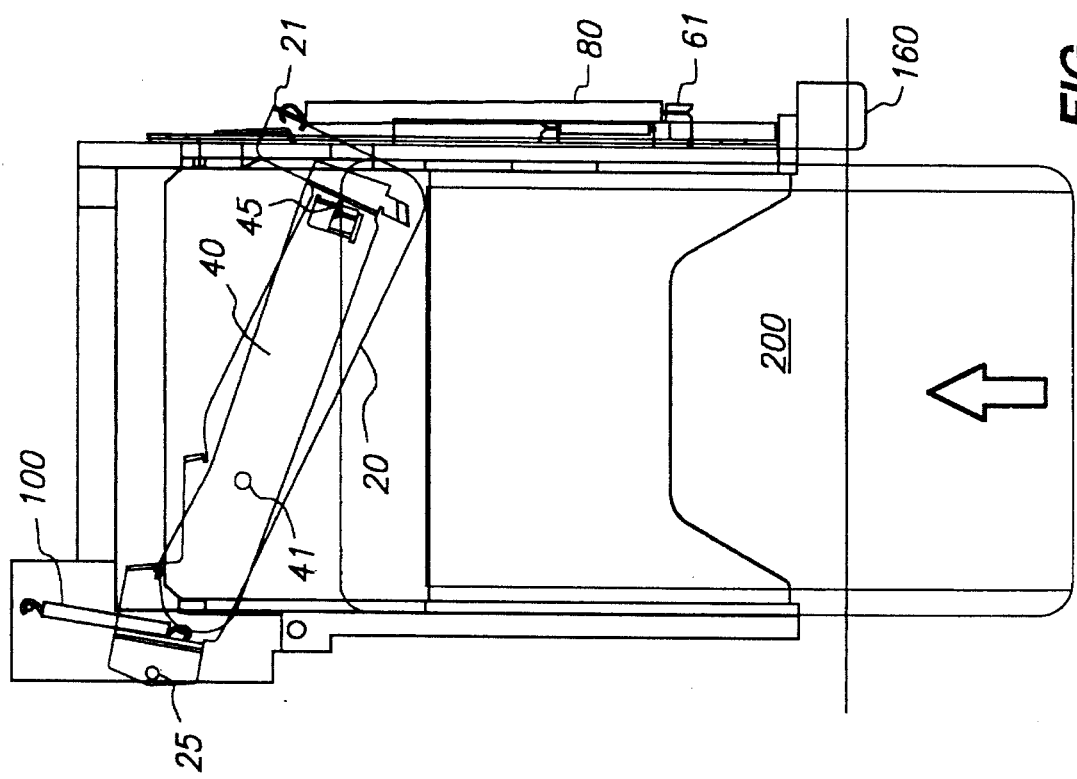
FIGS. 4a through 4g are wire frame drawings showing the operation of the first embodiment of the present invention as a card is inserted into it.
Figure 4A:
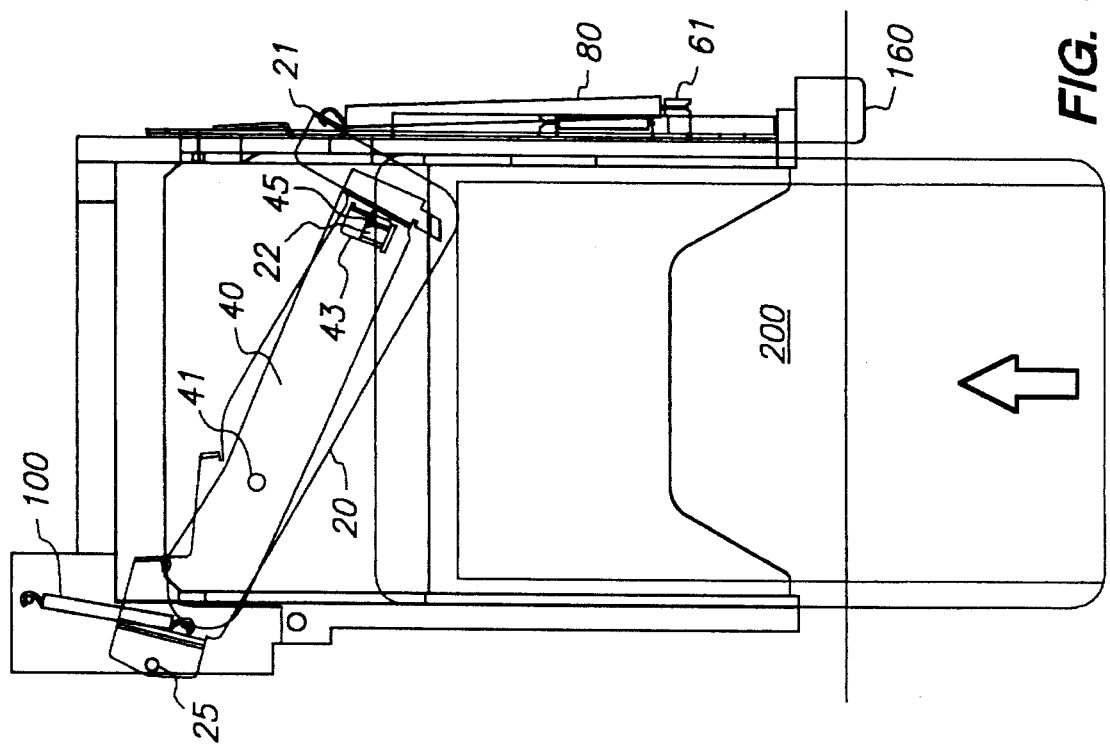
Figure 4C:
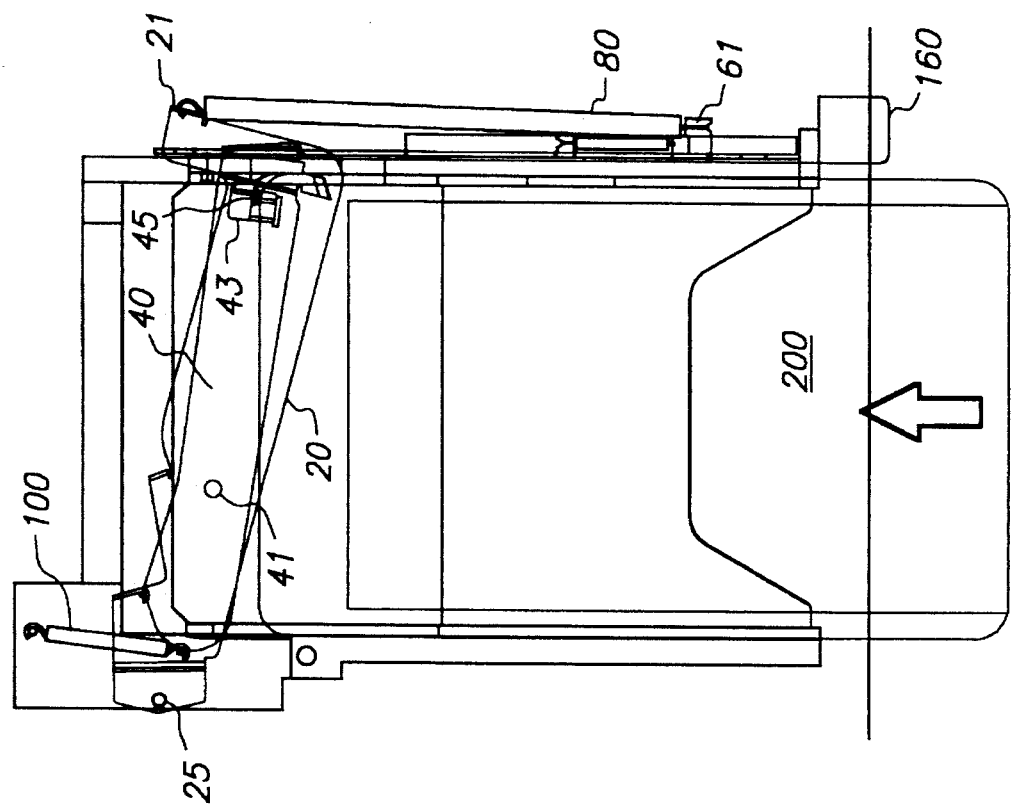
Figure 4D:
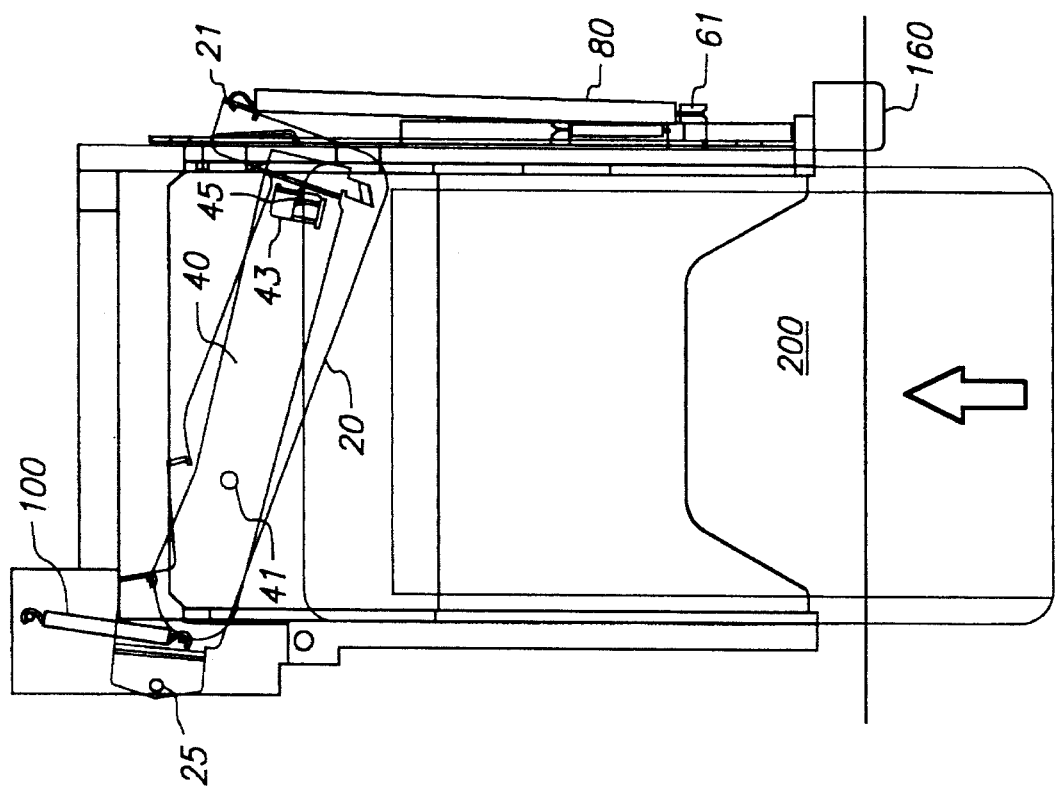
Figure 4F:
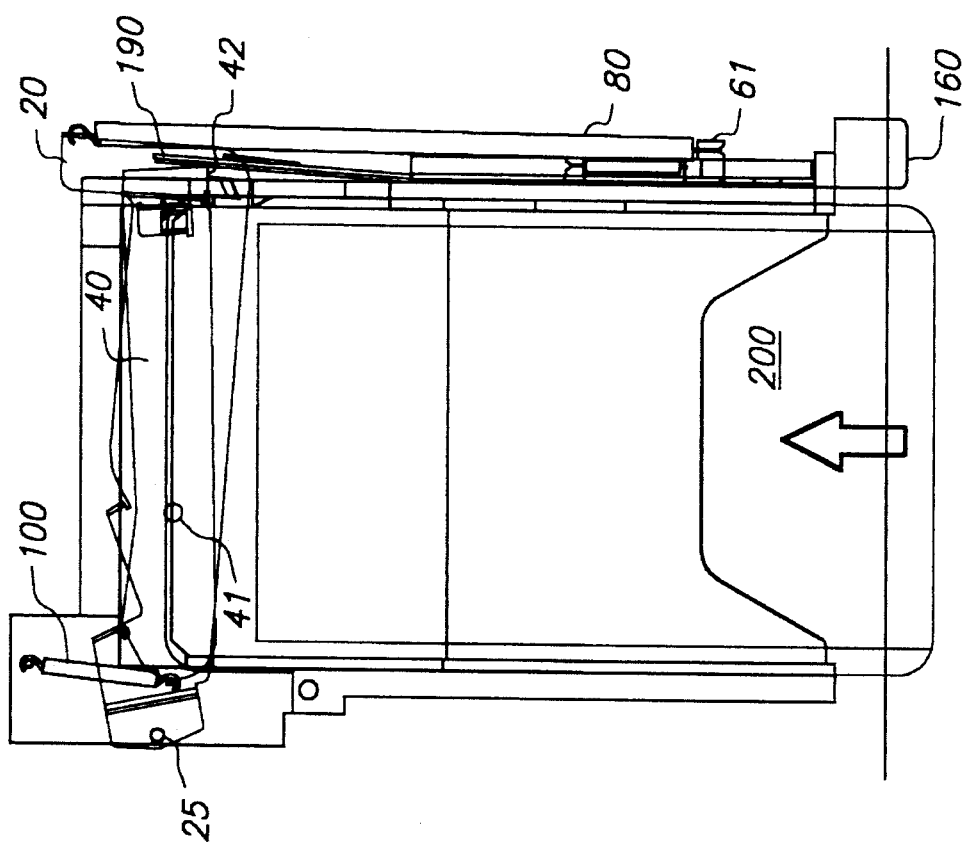
Figure 4E:
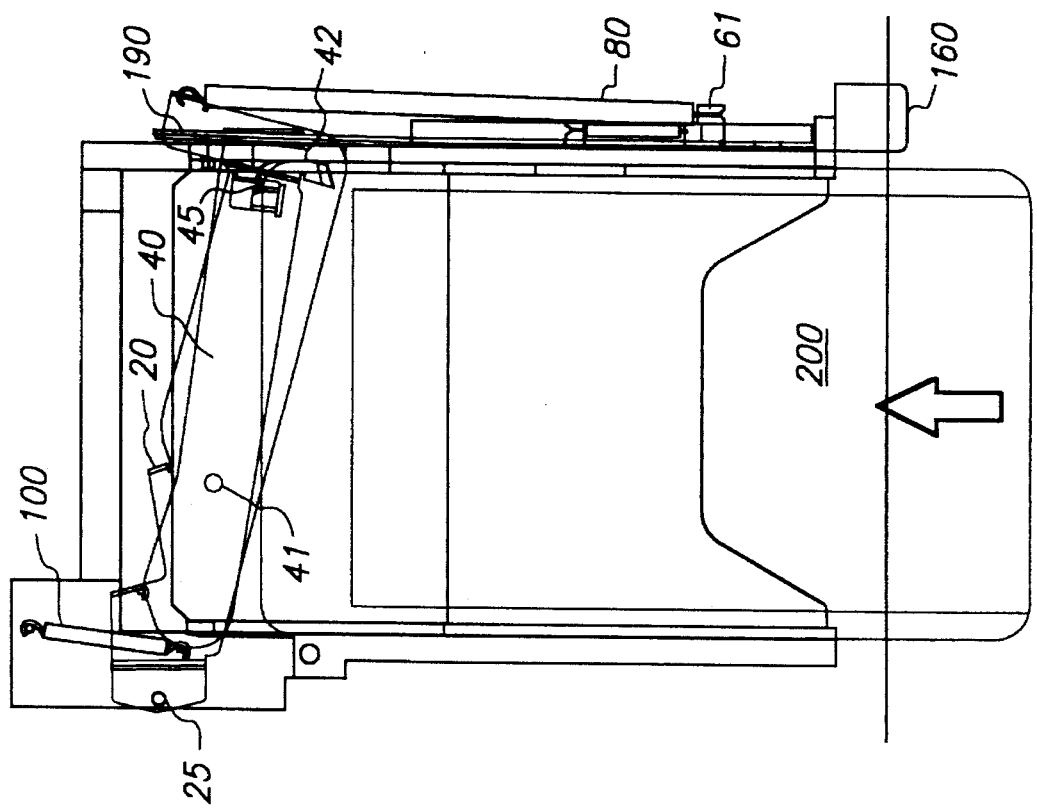
Figure 4G:
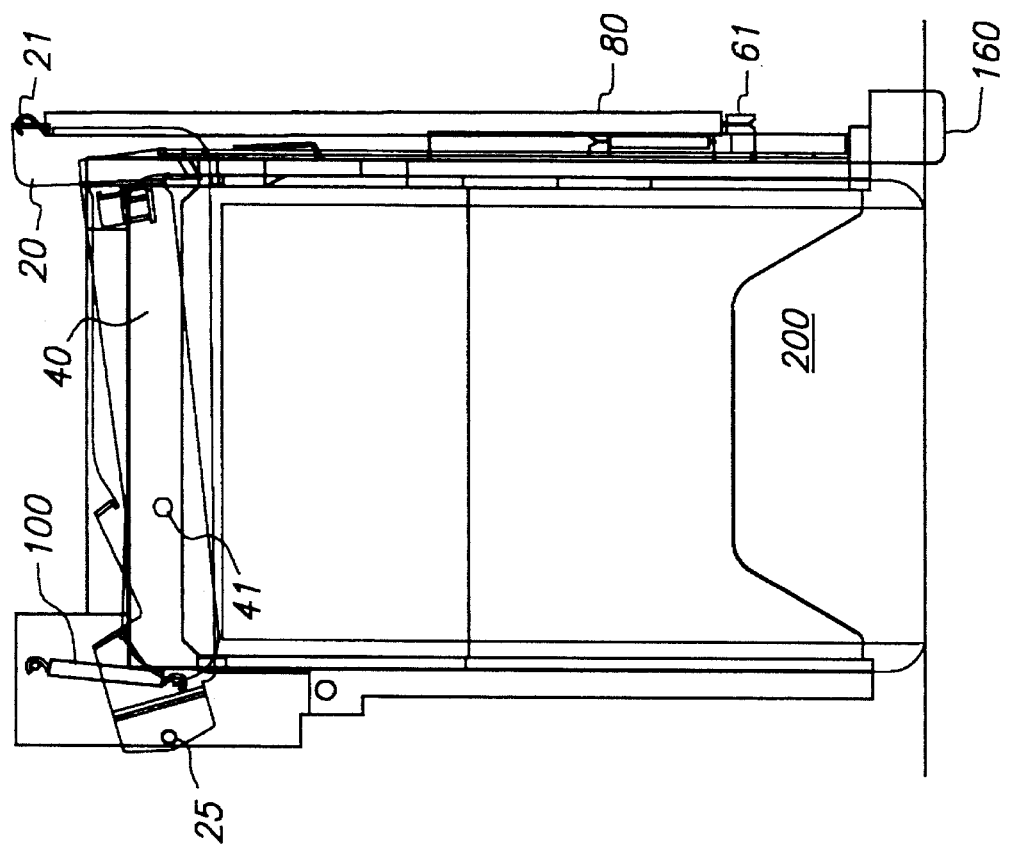

FIGS. 2 and 3 show the assembled housing and card ejection mechanism. In FIG. 2, both pairs of lever arms are illustrated in their fully extended position. They would be in this position when two cards have been fully inserted into the housing. FIG. 3 shows bottom ejection lever arm 20 and bottom wind lever arm 40 in their forward position, ready for a card to be inserted.

The process of inserting a card into the housing and arming the ejection mechanism is illustrated in FIG. 4a through 4g. At the start of the process (FIG. 4a), bottom ejection lever arm 20 and bottom wind lever arm 40 are in their fully forward, first position. Male severable coupling 22 is inserted into female severable coupling 43, thus linking the ejection lever arm and the wind lever arm together. Bottom first ejection spring 80, coupled between ejection spring attachment point 61 and ejection spring attachment arm 21, is in its first, fully relaxed position. As card 200 is inserted (FIG. 4b), it contacts second card ejection arm 45. As the card is further inserted (FIGS. 4c,d and e), the coupled lever arms pivot about ejection lever arm pivot 25, extending first ejection spring 80. As the coupled arms move even further back (FIG. 4f), latch ratchet 42 engages with one-way latch 190. Bottom wind lever arm 40 cannot move forward after it engages with latch 190. As ejection arm 20 is coupled to wind lever arm 40, it also cannot move forward. The completion of the insertion process (FIG. 4g) shows spring 80 extended to its fullest extent. In this fully cocked position, no force is placed on the card. Latch 190 and ratchet 42 hold the entire spring force.

Figure 5B:
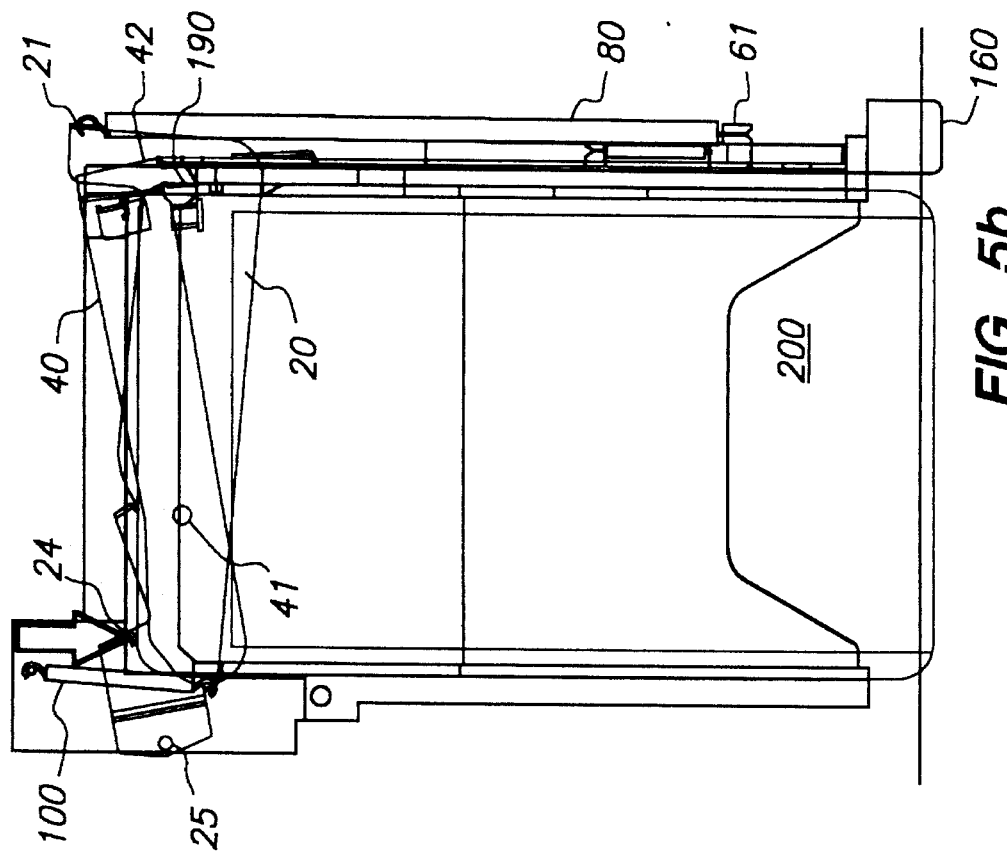
Figure 5A:
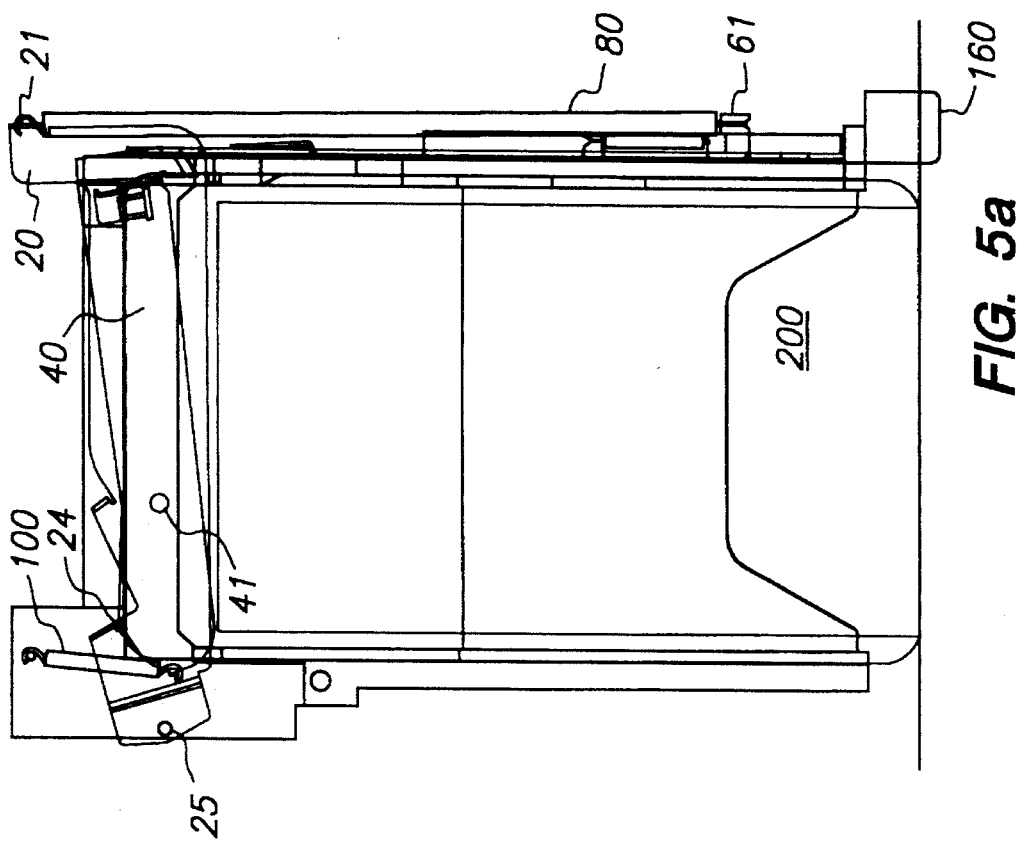

The card ejection process is illustrated in FIGS. 5a through 5j. When pushbutton 160 is depressed, bottom unlatch bar 120 slides into the housing. A small, wedge shaped portion of the end of unlatch bar 120 is thereby pushed between ejection lever 20 and wind lever 40, deflecting ejection lever 20 slightly downwards and forcing male severable coupling 22 out of female severable coupling 43. With proper design, the distance that unlatch bar 120 must travel is quite small, allowing the ejection button to be mounted nearly flush with the housing of the present invention. After pushing the ejection button, one-way latch 190 is still engaged with ratchet 42, which prevents wind lever 40 from moving. However, forcing male severable coupling 22 downwards and out from female severable coupling 43 permits bottom first ejection lever 20 to begin moving forward (FIGS. 5*b*,*c* and *d*). First card ejection arm 24 comes into contact with card 200 and applies a high force (roughly 9.5 lbs.) to the rear edge of the card, freeing it from the electrical connector. This force is only applied over a relatively short distance (4 mm in the first preferred embodiment).

Figure 5F:
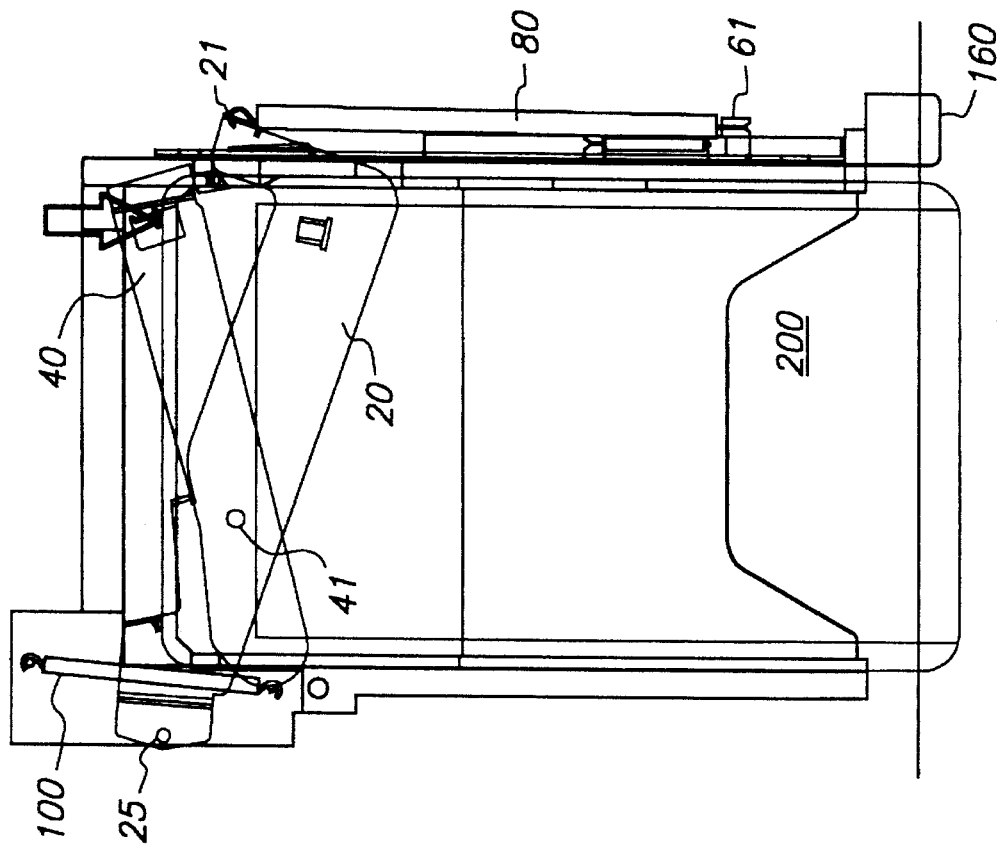
Figure 5E:
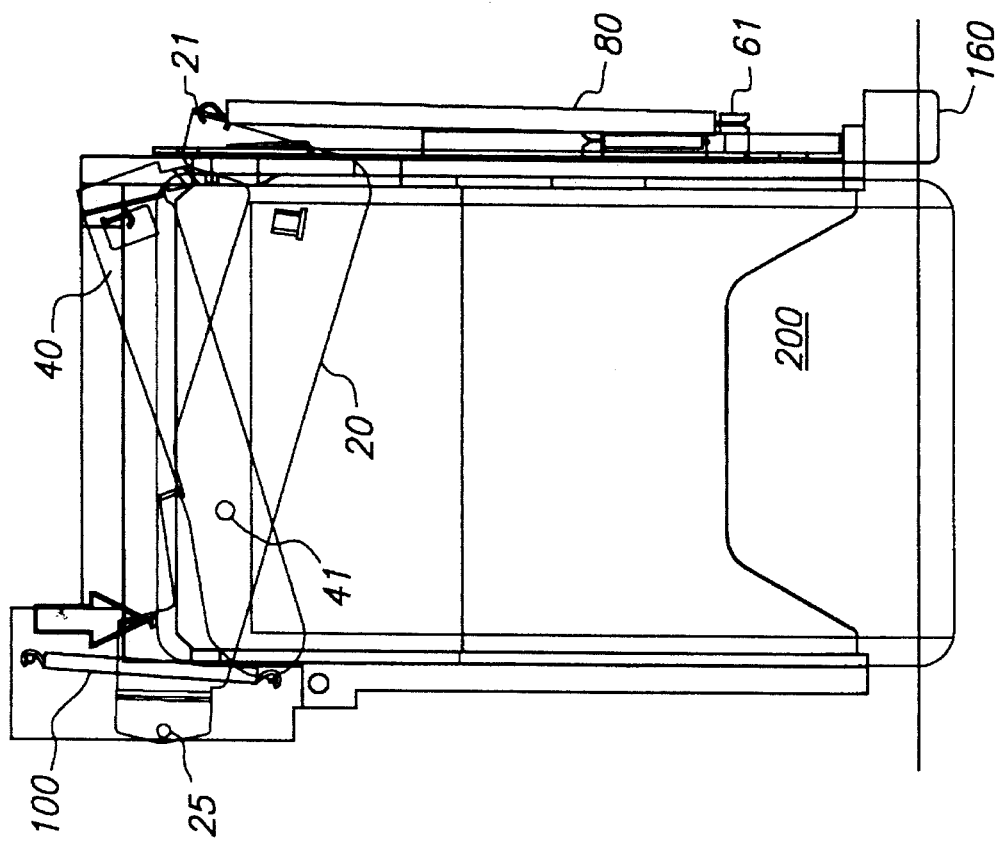
Figure 5H:
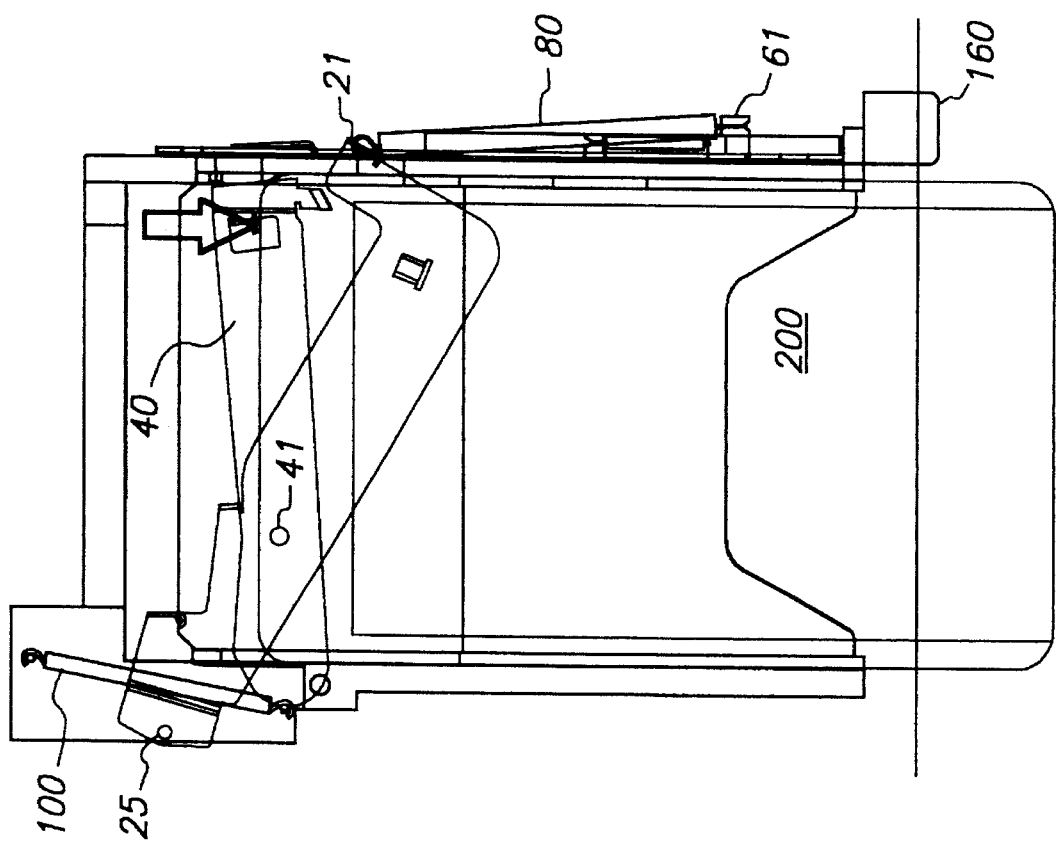
Figure 5G:
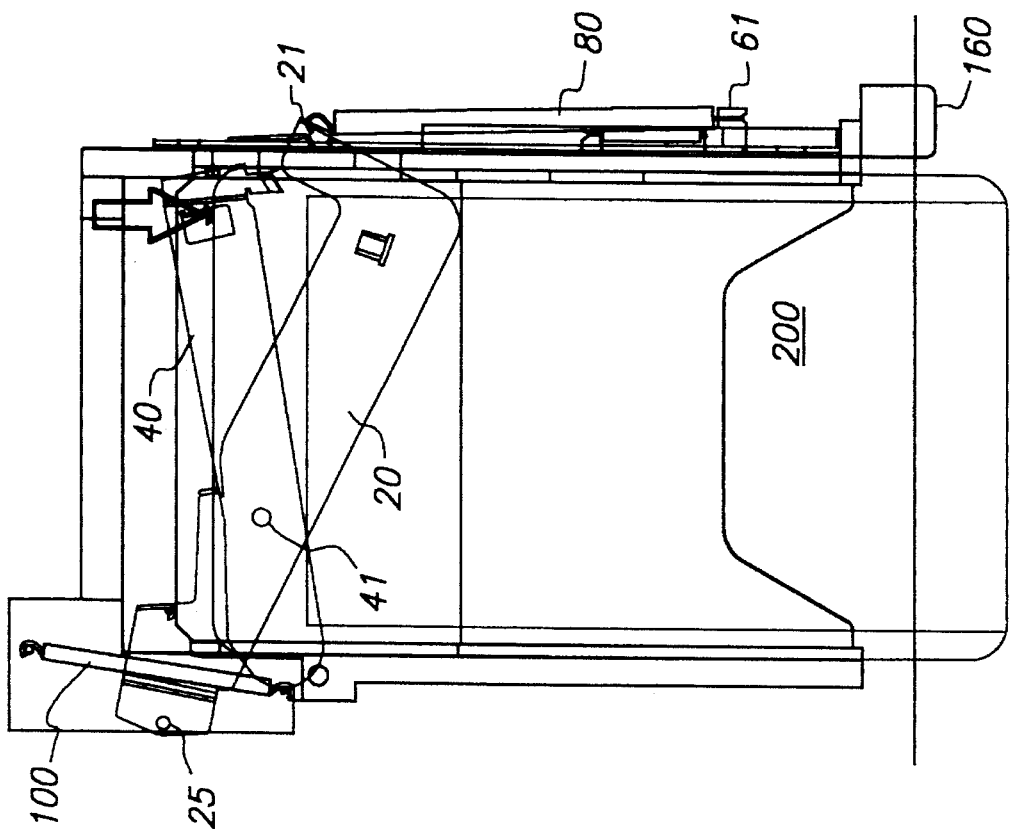

As ejection lever arm 20 pivots about ejection lever arm pivot 25, it is also translating around first and second wind lever pivots 23 and 41. This translating movement eventually pulls wind lever arm 40 sufficiently far to one side that ratchet 42 pulls away from and clears one-way latch 190 (FIG. 5*d*). After clearing the latch, wind lever arm 40 and ejection lever arm 20 continue to pivot forward around pivot 25. Second card ejection arm 45 comes into contact with card 200 (FIG. 5*f*) and continues to push card 200 out of the housing. First card ejection arm 24 loses contact with the card and does not contribute further to the ejection process. At this point, the force applied to the card has dropped, but this smaller force is being applied over a longer distance (FIGS. 5*f* through 5*h*).

As first ejection spring fully releases its stored energy in ejecting the card, re-cock spring 100 also begins to contract, pulling wind lever arm 40 and ejection lever arm 20 closer together around pivot points 23 and 41 (FIG. 5*i*). As the two lever arms are pulled together, male severable coupling 22 is pulled under part of wind lever arm 40 and extends itself into female severable coupling 43. Once the severable couplings are again coupled and re-cock spring 100 has fully released its stored energy, then the ejection mechanism is once again ready for the insertion of another card (FIG. 5*j*).

As the initiating of the ejection process only requires that the severable coupling between the ejection lever arm and the wind lever arm be severed, and as severing the coupling requires only a small amount of energy and a small deflection of the wind lever arm and the ejection lever arm relative to one another, a second embodiment of the present invention has incorporated a software controlled electrical ejection, wherein the pushbutton does not need to be pushed. In this embodiment, once the user has told the computer to eject the card, a signal is sent to the ejection mechanism. A small piece of memory metal, which shortens when a current is passed through it, receives this signal and begins to shorten. As it does, it can pull a small wedge-like object between the two lever arms, thereby uncoupling them and allowing the ejection lever arm to begin pivoting forward. It may also be possible to couple the memory metal directly to the first ejection lever arm and to use the contraction of the metal to pull the ejection arm apart from the wind lever arm. Again, as the force required to separate the two lever arms and begin the ejection process is small, many variations on this method will work equally well.

The present invention has now been described in detail, in the context of several specific embodiments. Nothing herein should be taken to limit this invention to the particular embodiments discussed. For example, the present invention could be used to eject credit or banking transaction cards from automatic teller machines, using the software initiated ejection, or the mechanism could be used to eject floppy disks from a floppy disk drive. The length of the lever arms, as well as the springs, may be varied to provide various levels of ejection force. A solenoid could be used instead of the memory metal to provide a software driven, electrically activated ejection. Given the various possibilities, the specification and drawings are, accordingly, to be regarded in an illustrative rather than in an restrictive manner.

What is claimed is:

1. An ejection mechanism for ejecting electronically active cards from a housing capable of holding at least one electronically active card, the housing having a first card slot for inserting electronically active cards and a rear end having at least one connector for coupling the electronically active card to a computing device, the ejection mechanism comprising:

a first lever arm mounted on the housing by a first pivot, the first lever arm pivoting about the first pivot towards the rear end as an electronically active card is inserted into the first card slot;

a first ejection spring coupled to the housing and the first lever arm, the first ejection spring being tensioned as the electronically active card is inserted into the first card slot;

a second lever arm, the second lever arm being mounted on the first lever arm by a second pivot, the second lever arm pivoting about the second pivot;

a severable coupling mounted on the first and second lever arms, the severable coupling holding the first and second lever arms together as an electronically active card is inserted into the housing;

a latch mounted on the housing, the latch releasably engaging the second lever arm when the electronically active card has coupled with the connector; and means for severing the severable coupling, the means for severing the coupling being triggered by a user of the computing device, the severing of the coupling allowing the first lever arm to pivot about the first pivot, forcing the electronically active card towards and out of the first card slot.

2. The ejection mechanism of claim 1 wherein the means for severing the severable coupling comprises at least a first pushbutton mounted on the housing, and a first slide means coupled to the housing and the first pushbutton, pressing the first pushbutton forcing the first slide means between the first and second lever arms, the second lever arm remaining latched by the latch and the first lever arm moving towards the front card slot under the impetus of the first ejection spring.

3. The ejection mechanism of claim 1 wherein the means for severing the severable coupling comprises an electronically activated electromechanical means triggered by a user of the computing device, the electronically activated electromechanical means forcing the first and second lever arms apart, allowing the first lever arm to move towards the front card slot and the second lever arm to remain stationary.

4. The ejection mechanism of claim 1 wherein the location of the first pivot and the first ejection spring allows the electronically active card to be fully inserted into the housing using only a small amount of force greater than that needed to couple the electronically active card to the connector.

5. The ejection mechanism of claim 1 wherein the second lever arm is released from the latch by means of the movement of the first lever arm as it pivots about the first pivot toward the first card slot.

6. The ejection mechanism of claim 5 wherein a re-cocking spring is coupled to the second lever arm and the housing, the re-cocking spring reestablishing the severable coupling after the first lever arm has moved toward the front card slot and the first ejection spring has released its tension.

7. The ejection mechanism of claim 5 wherein a large amount of force is applied to the electronically active card until the second lever arm is released and a smaller force being applied to the electronically active card thereafter until the first ejection spring has fully released its tension.

8. A housing for at least one card conforming to the PCMCIA standard, the housing having a front end with a slot for receiving the card and a rear connector block for coupling the card to a computing device, the housing having an ejection means, the ejection means comprising:

first lever means pivotably mounted on the housing;

first spring means for biasing the first lever means into a first forward position, the first spring means being tensioned when inserting a card into the slot moves the first lever means into a second rear position;

second lever means mounted on the first lever means and coupled releasably thereto;

latch means for holding the second lever means in the second rear position when the card is fully inserted into the housing;

means for releasing the first lever means from the second lever means, allowing the first lever arm to return to the first forward position by means of the first spring means; and second spring means for recoupling the first and second lever means.

9. The housing of claim 8 wherein the first and second lever means are coupled together by means of a male fitting on the first lever means and a female fitting on the second lever means.

10. The housing of claim 9 wherein the means for releasing the first lever means from the second lever means comprises a sliding wedge means mounted on the housing, the sliding wedge means being coupled to a button means, pressing the button means forcing the wedge means between the male and female fittings.

11. The housing of claim 10 wherein the sliding wedge means is moved between the male and female fittings by an electromechanical means.

12. The housing of claim 11 wherein the electromechanical means comprises a piece of memory metal which contracts when receiving an electrical ejection signal, the contraction of the memory metal pulling the sliding wedge between the male and female fittings.

* * * * *